United States Patent
Carlson

(10) Patent No.: US 6,876,451 B1
(45) Date of Patent: Apr. 5, 2005

(54) MONOLITHIC MULTIAXIS INTERFEROMETER

(75) Inventor: Andrew Eric Carlson, Middletown, CT (US)

(73) Assignee: Zygo Corporation, Middlefield, CT (US)

(*) Notice: Subject to any disclaimer, the term of this patent is extended or adjusted under 35 U.S.C. 154(b) by 0 days.

(21) Appl. No.: 09/940,076

(22) Filed: Aug. 27, 2001

Related U.S. Application Data

(60) Provisional application No. 60/227,901, filed on Aug. 25, 2000.

(51) Int. Cl.[7] ................................................ G01B 9/02
(52) U.S. Cl. ...................................... 356/498; 356/492
(58) Field of Search ................................ 356/485, 486, 356/498, 500, 508, 510, 511, 487, 492

(56) References Cited

U.S. PATENT DOCUMENTS

| | | | |
|---|---|---|---|
| 4,746,216 A | * 5/1988 | Sommargren | 356/485 |
| 4,752,133 A | 6/1988 | Sommargren | 356/349 |
| 4,802,764 A | 2/1989 | Young et al. | 356/349 |
| 4,802,765 A | 2/1989 | Young et al. | 356/349 |
| 4,859,066 A | 8/1989 | Sommargren | 356/349 |
| 4,881,815 A | 11/1989 | Sommargren | 356/349 |
| 4,881,816 A | 11/1989 | Zanoni | 356/349 |
| 4,883,357 A | 11/1989 | Zanoni et al. | 356/349 |
| 4,890,921 A | * 1/1990 | Pond et al. | 356/485 |
| 5,056,921 A | * 10/1991 | Chaney | 356/493 |
| 5,064,289 A | 11/1991 | Bockman | 356/351 |
| 5,801,832 A | 9/1998 | Van Den Brink | 356/358 |
| 6,020,964 A | 2/2000 | Loopstra et al. | 356/358 |
| 6,084,673 A | 7/2000 | Van Den Brink et al. | 356/358 |
| 6,163,379 A | 12/2000 | de Groot | 356/493 |
| 6,542,247 B2 | 4/2003 | Bockman | 356/493 |

* cited by examiner

Primary Examiner—Gregory J. Toatley, Jr.
Assistant Examiner—Michael A. Lyons
(74) Attorney, Agent, or Firm—Fish & Richard P.C.

(57) ABSTRACT

A multi-axis interferometer includes a multiplexer portion and a beam splitter portion integrated into the same optically transmissive monolith. The multiplexer portion is configured to split an input beam into a corresponding plurality of intermediate beams, each of which is directed toward the beam splitter portion through a corresponding output port of the multiplexer portion. The beam splitter portion is configured to separate the intermediate beam into a measurement component and a reference component.

12 Claims, 9 Drawing Sheets

MONOLITHIC MULTIAXIS INTERFEROMETER

RELATED APPLICATIONS

This application claims the benefit of the priority date of U.S. provisional application 60/227,901 filed on Aug. 25, 2000, the contents of which are herein incorporated by reference.

FIELD OF INVENTION

This invention relates to distance-measuring equipment, and in particular, to interferometers.

BACKGROUND

In the fabrication of an integrated circuit, there are steps during which a wafer rests on a moveable stage under a projector. As the stage moves, it experiences linear translation in a direction parallel to one of two coordinate axes that define the plane of the wafer. In addition, the stage experiences rotation about any of the three coordinate axes. During these steps, it is desirable to know, with great precision, the position and orientation of the moveable stage relative to the projector.

One approach to determining the motion of the stage is to use an interferometer to determine the distance to a measurement spot along the edge of the stage. This, however, only provides the extent to which the stage has translated along one of the coordinate axes. It doles not provide information on the rotation of the stage about the three coordinate axes.

To obtain information about both the rotation and the translation of the stage, it is known to use three interferometers to measure the distance to three different reference spots that define a triangle on the edge of the stage. From these three distance measurements, one can infer the extent and direction of rotation experienced by the stage. For example, if a first reference spot is found to have moved closer to the interferometer and a second reference spot immediately below the first spot is found to have moved further from the interferometer, one can infer that the plate has rotated about a line joining the first and second reference spots. From the relative positions and distances to the first and second reference spots, one can calculate the extent of this rotation.

It is also known to integrate the three separate interferometers into a single "multi-axis" interferometer, in which a single laser beam is split into three beams (one for each axis) by a beam multiplexer. These beams are directed to separate assemblies that typically include a polarizing beam splitter cube, a plane mirror, a corner cube retro-reflector, quarter-wave retarders, and mixing polarizers, all of which are oriented and configured to form reference beams and measurement beams for each interferometer axis. Assemblies of this type are described in U.S. Pat. No. 4,802,764 to Young et al. and U.S. Pat. No. 4,883,357 to Zanoni, et al., the contents of which are herein incorporated by reference.

The optical elements for directing the various beams in a multi-axis interferometer must be precisely aligned with each other for the multi-axis interferometer to provide accurate measurements. This alignment process is carried out at the time of installation and periodically thereafter, as the accumulated effects of continued operation cause a deterioration in alignment.

In some cases, it is desirable to measure the position of several structures using a single multi-axis interferometer. When this is the case, the number of interferometer axes, and hence the number of components to be aligned, increases. This makes alignment more difficult.

SUMMARY

The invention provides a multi-axis interferometer in which a single monolithic structure includes both the optical elements for forming and directing the beams for each interferometer axis and a multiplexer for dividing a single input beam into beams for each interferometer axis.

In one embodiment, the multi-axis interferometer provides a multi-axis interferometer having an optically transmissive monolith. The monolith has a multiplexer portion and a beam splitter portion. The multiplexer portion is configured to split an input beam into a corresponding plurality of intermediate beams, each of the intermediate beams being directed toward the beam splitter portion through a corresponding output port of the multiplexer portion. The beam splitter portion is configured to separate the intermediate beam into a measurement component and a reference component.

In one embodiment, the multiplexer portion includes a first interior face and a second interior face opposite to the first interior face. An output port is disposed on the second interior face. The output port can include a beam steering element, for example a refractive element for refracting a beam incident from the first interior face into an intermediate beam normal to the second interior face. In one aspect, the beam steering element is a diffraction grating. However, the beam steering element might also include a volume of material having an index of refraction selected to refract the beam incident from the first interior face into the intermediate beam normal to the second interior face. To form intermediate beams of substantially the same power density, the partially transmissive refractors can have transmissivities selected such that the each of the intermediate beams carries substantially the same power as any other intermediate beam.

The interferometer of the invention can also include a corner reflector in optical communication with the output port and the beam splitter portion. The corner reflector in this embodiment is configured to direct the intermediate beam into the beam splitter portion.

In another embodiment, the multi-axis interferometer includes an optically transparent monolith having a multiplexing layer that divides an input beam into a plurality of intermediate beams and a beam splitting layer that directs a measurement component of each of the intermediate beams along a measurement path, and a reference component of each of the intermediate beams along a reference path. When the reference path includes a target, the path length difference between these two paths provides a basis for measuring distance to an output coupler in optical communication with the multiplexing layer and the beam splitting layer., One multiplexing layer includes a first reflector, a second reflector opposite the first reflector; and a beam steering facet oriented to direct the input beam toward the second reflector at a grazing angle. This beam steering facet can be an angled portion of the first reflector.

The output coupler can include a partially transmissive medium disposed to intercept the input beam. Optionally, the output coupler includes a beam steering element for altering a direction of the intermediate beam. Suitable beam steering elements include a diffraction grating or a region having an appropriately selected refractive index.

These and other features of the invention will be apparent from the following detailed description and the accompanying figures, in which:

DETAILED DESCRIPTION

Figure 1:
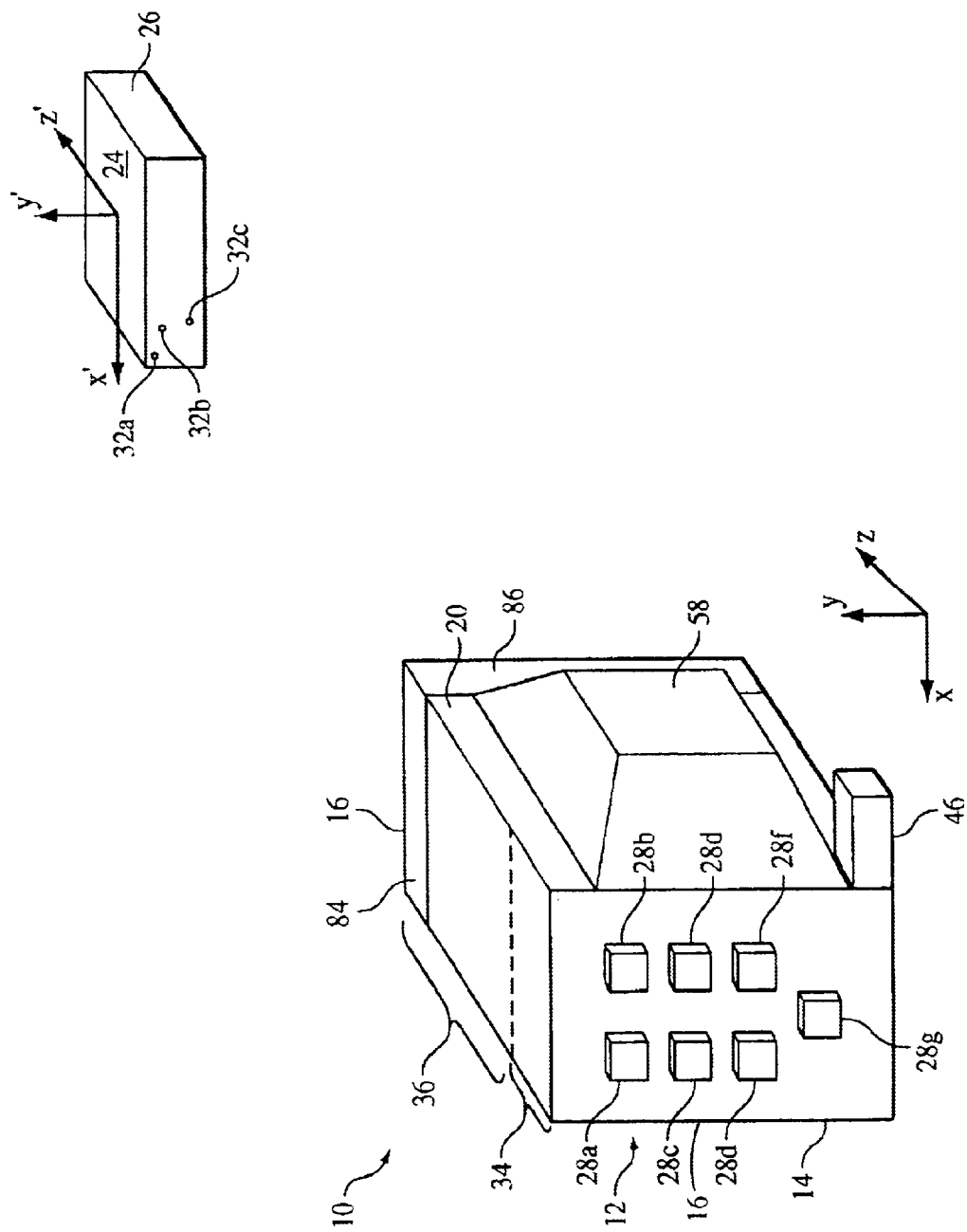
FIG. 1 is an isometric view of a multi-axis interferometer.

A multi-axis interferometer 10 according to the invention, as shown in FIG. 1, includes an optically transparent monolith 12 having a rear face 14, a measurement face 16 opposite the rear face 14, a reference face 18 perpendicular to and connecting the edges of the measurement face 16 and the rear face 14, and an input/output ("I/O") face 20 opposite the reference face 18. With reference to the coordinate system shown in FIG. 1, the measurement and rear faces 16, 14 are parallel to the xy plane; the reference face 18 and the I/O face 20 are parallel to the yz plane.

The multi-axis interferometer 10 is shown illuminating an edge 22 of a target 24 with an array of measurement beams to detect translation and rotation of the target 24. With reference to the local x'y'z- coordinate system associated with the target 24, the target 24 is said to experience "pitch" when it rotates about the x' axis, "yaw" when it rotates about the y' axis, and "roll" when it rotates about the z' axis. In the configuration shown, the interferometer 10 cannot detect roll because the distance between the interferometer 10 and the illuminated edge 22 does not change as the target 24 rolls. For similar reasons, the interferometer 10 configured as shown does not detect translation along either the y' or the x' axis. These motions can be detected by placing a second interferometer to illuminate a perpendicular edge 26 of the target 24.

Figure 2:
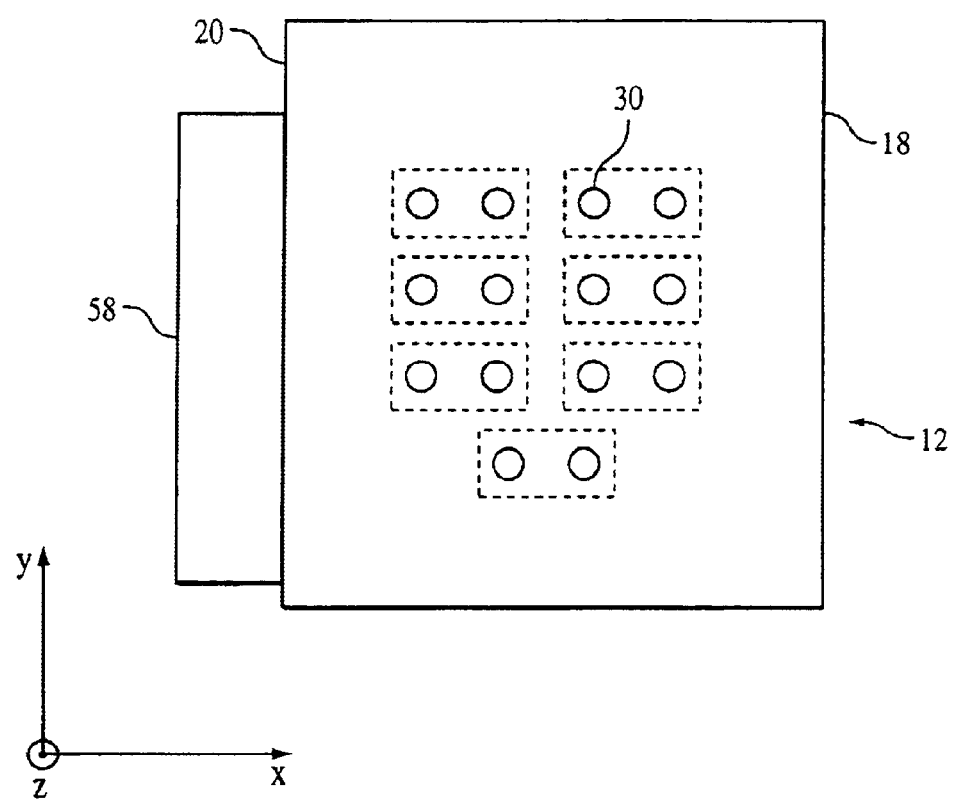
FIG. 2 is a plan view of the measurement face of the interferometer of FIG. 1.

An array of retro-reflectors 28a–g (designated generally as 28) is disposed on the rear face 14 of the monolith 12. In the illustrated embodiment, there are four rows of retro-reflectors, three of which have two columns and one of which has only one column. Each retro-reflector 28 is a corner of a cube having a reflective inner surface. In operation, the array of retro-reflectors 28a–g forms a corresponding array of measurement beams on the measurement face 16, as shown in FIG. 2. Each retro-reflector 28 (shown in dashed lines in FIG. 2) is associated with one beam 30 emerging from the portion of the measurement face 16 directly opposite the retro-reflector 28. Although there appear to be twice as many beams 30 as there are retro-reflectors 28, this is only an illusion. As will be seen below, the folded path traversed by each beam 30 within the monolith 12 is such that the beam 30 makes two round trips between the monolith 12 and the target 24.

The configuration of retro-reflectors 28 depends on the constraints of the application. Referring back to FIG. 1, each measurement spot 32a–c on the target 24 is associated with one retro-reflector 28a–c. Thus, three retro-reflectors 28a–c are sufficient to illuminate the three measurement spots 32a–c that are required to obtain translation, pitch, and yaw of a first target 24. The illustrated embodiment includes three additional retro-reflectors 28d–f for providing beams used to measure translation, pitch, and yaw of a second target (not shown). These additional retro-reflectors 28d–f enable a single interferometer 10 to detect relative motion between the first and second targets. The remaining retro-reflector 28g and its associated beam is used for measuring surface roughness of the illuminated edge 22. This information is used to correct the measurement made by the measurement beams associated with the remaining retro-reflectors 28a–f.

The monolith 12 itself is divided into a multiplexing layer 34 and a beam-splitting layer 36. As indicated by the dashed line in FIG. 1, these two layers are not joined or affixed to each other. The multiplexing layer 34 and the beam-splitting layer 36 are part of the same monolithic structure in much the same way that the individual transistors of an integrated circuit are part of, or integral with, the same silicon crystal. The multiplexing layer 34 extends from the rear face 14 to the beginning of the beam-splitting layer 36 in the interior of the monolith 12. This multiplexing layer 34 has opposed first and second mirrored interior faces 35, 38, best seen in FIG. 3, that are perpendicular to the rear face 14 of the monolith 12.

Figure 3:
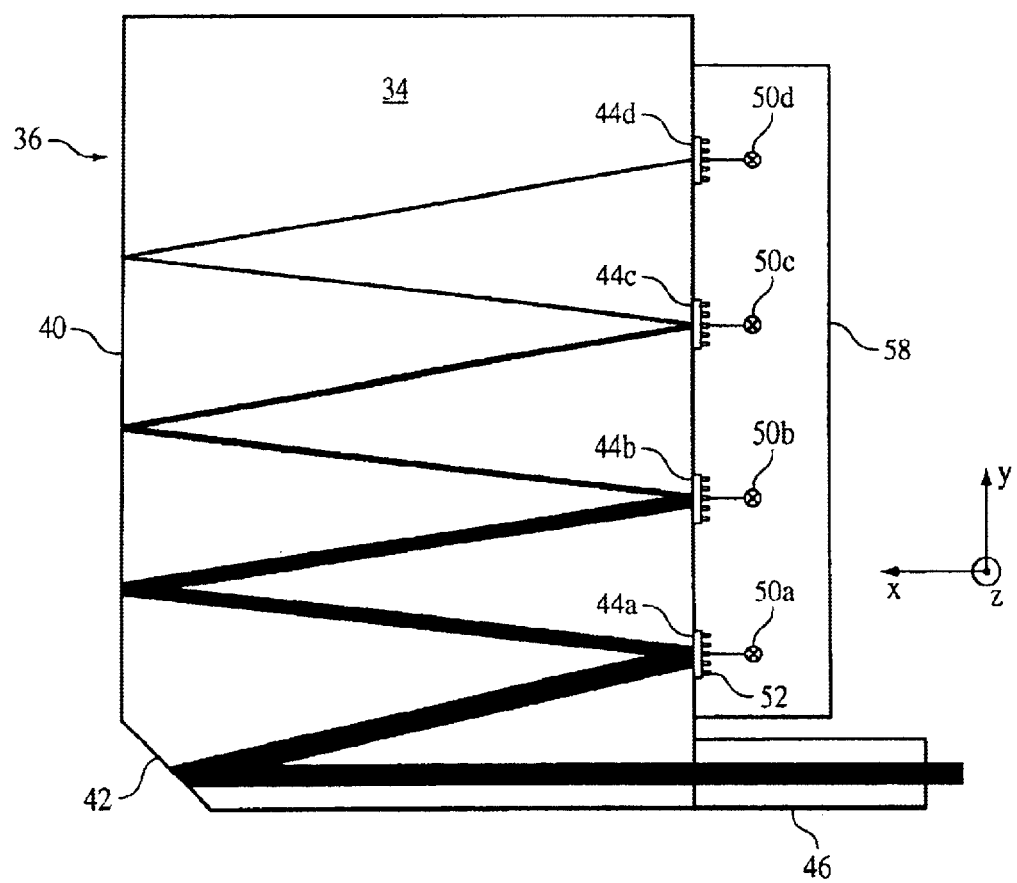
FIG. 3 is a cross-section of the beam multiplexing layer of the interferometer shown in FIG. 1.

FIG. 3 shows a cross-section obtained by slicing the multiplexing layer 34 along the xy plane. The first interior face 35 has a first facet 40 that is coplanar with the reference face and a second facet 42 that makes an obtuse angle with the first facet 40. The second interior face 38 is punctuated by a plurality of output couplers 44a–d (designated generally as 44) arranged along a line extending parallel to the rows in the array of retro-reflectors 28. The number of output couplers 44 on the second interior face 38 corresponds to the number of such rows.

Referring back to FIG. 1, a feed structure 46, also integral to the monolith 12, protrudes from a bottom edge of the I/O face 20. The feed structure 46 redirects an input laser beam into the multiplexing layer 34, where it is split into a plurality of intermediate beams 50a–d (shown in FIG. 3). Each of the intermediate beams has essentially the same power as all the other intermediate beams.

As shown in FIG. 3, the feed structure 46 directs an input beam 48 toward the second facet 42. The second facet 42 reflects the input beam 48 toward a first output coupler 44a along a path that makes a grazing angle relative to a line normal to the second interior face 38. The transmissivity of the first output coupler 44a is selected such that a first quarter of the power in the input beam 48 is transmitted through the first output coupler 44a to form a first intermediate beam 50a. The input beam 48, with its power density diminished by one-quarter, is reflected back toward the first facet 40. Because the input beam 48 is incident on the first facet 40 at a grazing angle, it is reflected by the first facet 40 toward a second output coupler 44b. The transmissivity of the second output coupler 44b is selected such that one third of the power incident thereon is transmitted to form a second intermediate beam 50b. Since the residual power incident on the second output coupler 44b is three-quarters of the original power in the input beam 48, this one third of three-quarters amounts to one-quarter, which is the same amount of power that was transmitted through the first output coupler 44a. As a result, the second intermediate beam 50b has the same power density as the the first intermediate beam 50a. This pattern continues with the third output coupler 44c, which transmits one half of the residual power incident thereon (which amounts to one-quarter of the original power available in the input beam 48), and the fourth and final output coupler 44d, which transmits all the residual power incident thereon. This results in the generation of four intermediate beams 50a–d that ultimately enter the beam-splitting layer 36. While the illustrated example applies to the case of four output couplers 44a–d, the principle shown is applicable to other numbers of output couplers 44.

As shown in FIG. 3, when the input beam 48 is incident on an output coupler 44, it is incident at a grazing angle relative to the second interior face 38. This is useful because it allows the reflected portion of the input beam 48 to be reflected back and forth across the multiplexing layer 34 along a zigzag path. It is undesirable, however, for the transmitted portion of the input beam 48 to proceed along this grazing angle as it passes through the output coupler 44.

The output coupler 44 includes a refractive component for bending the transmitted portion of a beam incident at a grazing angle into an intermediate beam 50 that is normal to the second interior face 38. In the illustrated embodiment, this is achieved by providing a suitable diffractive element, such as a diffraction grating 52, as part of the output coupler 44. Other refractive components can be used however. For example, the refractive component can be a volume of monolith 12 having an appropriate geometry and containing a material having an appropriately selected index of refraction.

Figure 4:
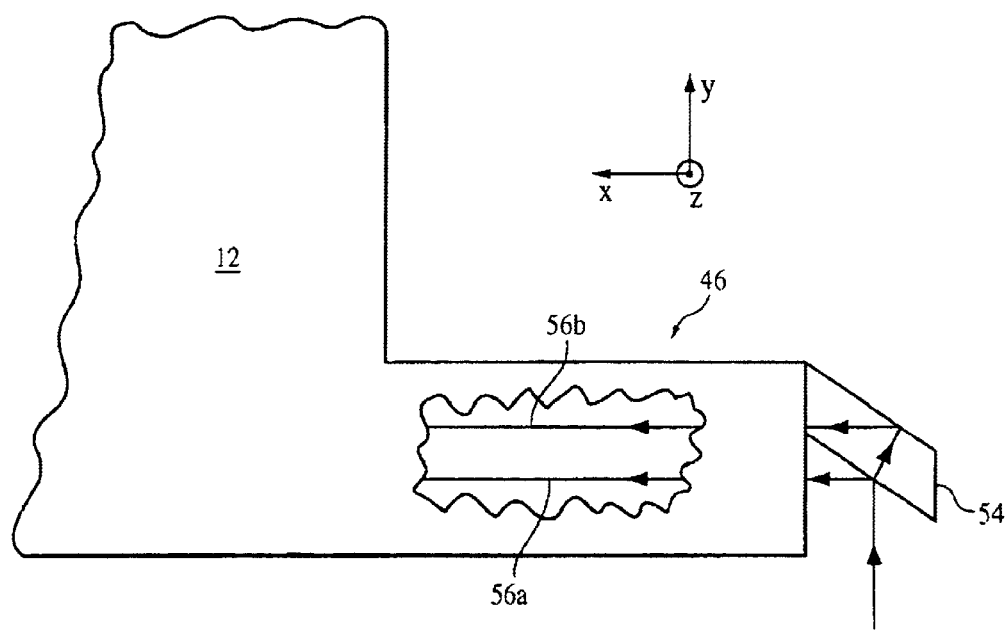
FIG. 4 is a cross-section of the feed structure of the interferometer shown in FIG. 1.

In one embodiment, shown in FIG. 4, the feed structure 46 includes a non-polarizing beam splitter 54 that splits the input beam 48 into a first feed beam 56a and a second feed beam 56b. This second feed beam 56b is not shown in FIG. 3 because it is out of the plane of the figure. The first feed beam 56a will be split into the intermediate beams 50 that illuminate a first column of retro-reflectors. The second feed beam 56b will be split into the intermediate beams 50 that illuminate a second column of retro-reflectors. The separation between the two columns of retro-reflectors in FIG. 1 (and hence between the second and third columns of beams in FIG. 2) corresponds to the separation between the first and second feed beams 56a, 56b in FIG. 4. When a feed structure 46 such as that shown in FIG. 4 is in use, the operation of the multiplexing layer 34 is identical to that described above, with the exception that the multiplexing layer 34 operates on the feed beams rather than directly on the input beam 48.

Figure 5:
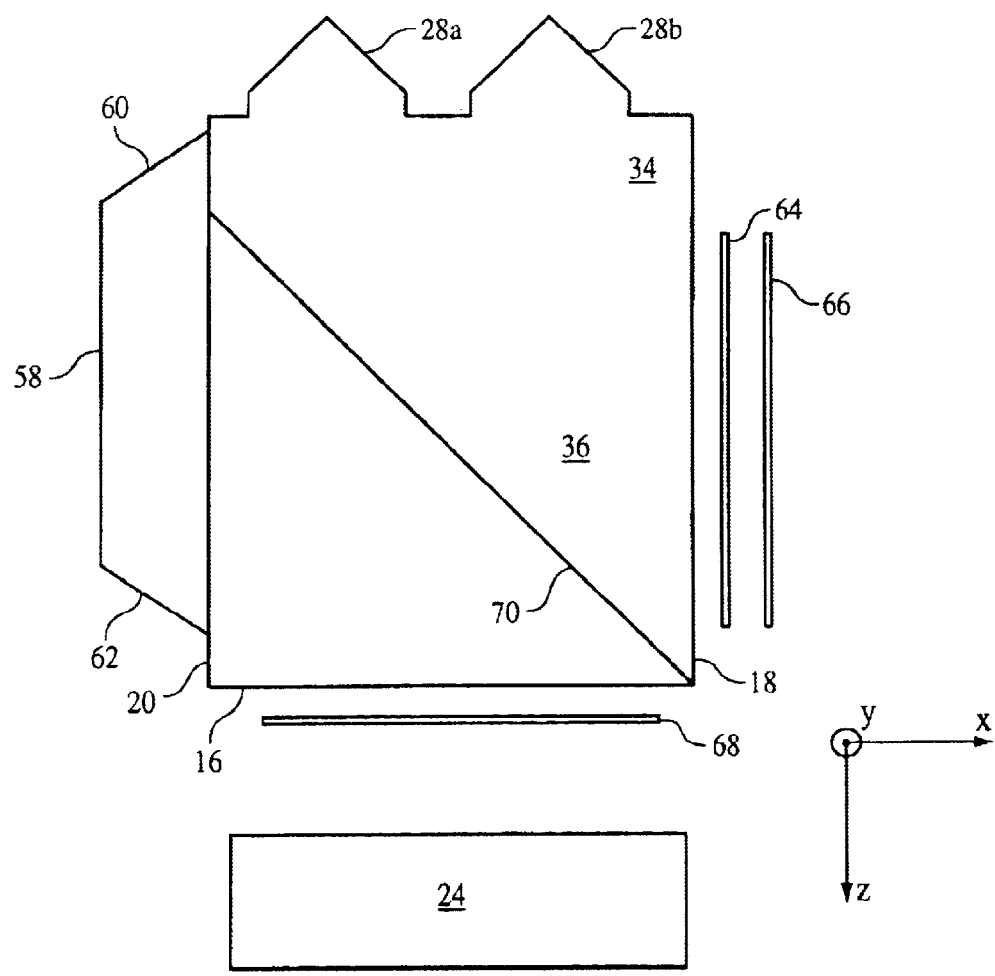
FIG. 5 is a cross-section of the interferometer showing the beam-splitting plane.
Figure 6:
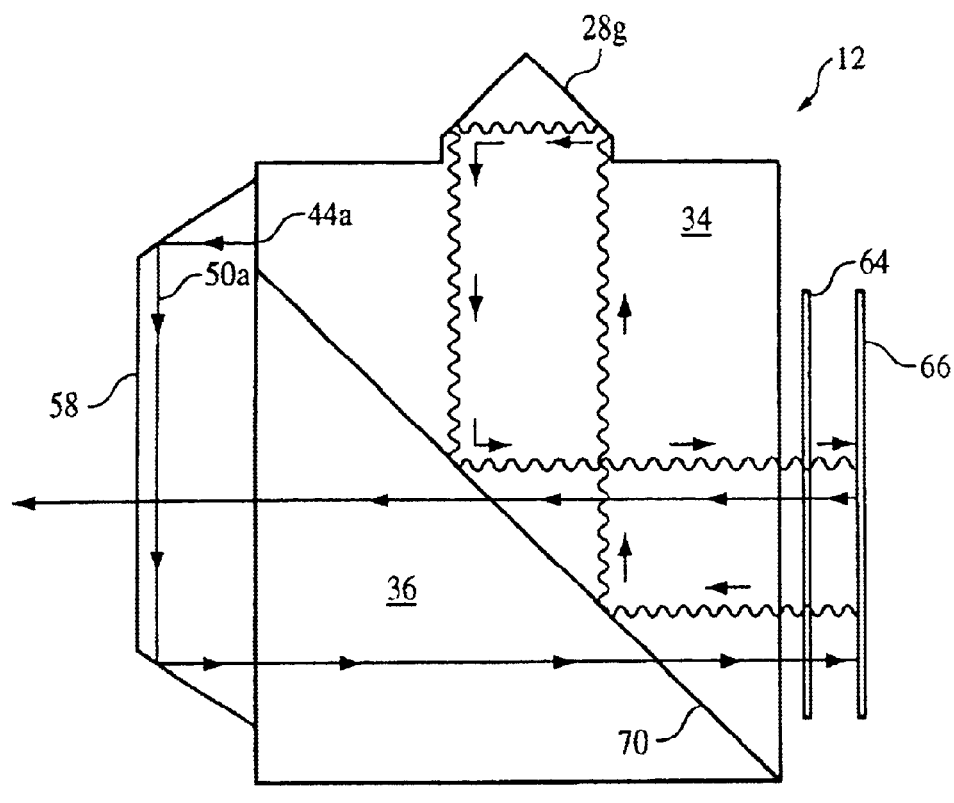
FIG. 6 shows the path followed by the reference component of the intermediate beam in a plane having one retro-reflector.
Figure 6:
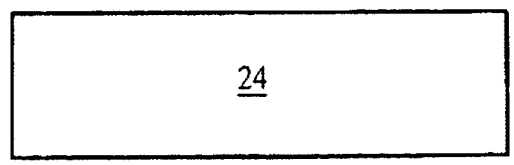

The beam-splitting layer 36, shown in the cross section of FIG. 5, is bounded by the I/O face 20, the reference face 18, the measurement face 16, and by the multiplexing layer 34. A corner reflector 58 is mounted on the I/O face 20 and oriented to direct intermediate beams 50 (shown in FIGS. 6 and 7) emerging from the output couplers 44 into the beam-splitting layer 36. FIGS. 5 and 6 show an intermediate beam 50a exiting the output coupler 44 in the −x direction and being reflected in the z direction by a rear facet 60 of the corner reflector 58. A front facet 62 opposite the rear facet intercepts intermediate beams 50 traveling in the z direction and reflects them in the +x direction, into the beam-splitting layer 36 of the monolith 12.

The interferometer 10 also includes two quarter-wave retarders. A quarter-wave retarder is an optical element that alters the polarization of light passing through it. When linearly polarized light having a first polarization vector passes through a quarter-wave retarder, it is transformed into circularly polarized light. If this circularly polarized light is reflected back into the quarter-wave plate, (so that it is now circularly polarized in the opposite direction) it is transformed back into linearly polarized light having a second polarization vector orthogonal to the first polarization vector.

A first quarter-wave retarder 64 is mounted between the reference face 18 and a reference mirror 66 disposed outside the monolith 12 on a plane parallel to the reference face 18. A second quarter-wave retarder 68 is mounted adjacent to the measurement face 16 such that, when a target 24 is positioned for illumination by the interferometer 10, the second quarter-wave retarder 68 lies between the measurement face 16 and the target 24.

A beam-splitting plane 70 bisects the beam-splitting layer 36 along a diagonal. The beam-splitting plane 70 is coated with a material that transmits light of one polarization but reflects light of another, orthogonal polarization. In this way, the beam-splitting plane 70 splits a beam having mixed polarization into two linearly polarized beams having orthogonal polarization vectors.

The input beam 48 of the interferometer 10 includes two orthogonally polarized components: a reference component and a measurement component. As these components traverse the monolith 12, they lose and then recover their original polarization states.

For example, upon entering the beam-splitting layer 36, the reference component has a first linear polarization (the "P" polarization). This polarization is identified by the straight line within the corner reflector 58. As it traverses the monolith 12, the reference component becomes orthogonally polarized ("S" polarized). This portion of the reference component is identified by the wavy line in FIG. 6. Before it finally exits the monolith 12, the reference component recovers its original polarization, which is shown by the straight line exiting the monlith 12.

Similarly, the measurement component enters the beam-splitting layer 36 with a second linear polarization (the "S" polarization) orthogonal to the P polarization. This polarization is identified by the wavy line in the corner reflector 58 of FIG. 7. As it traverses the monolith 12, the measurement component becomes "P" polarized. This portion of the reference component is identified by the straight line in FIG. 7. Before it finally exits the monolith 12, the measurement component recovers its original polarization, which is shown by the wavy line exiting the monlith 12.

Figure 7:
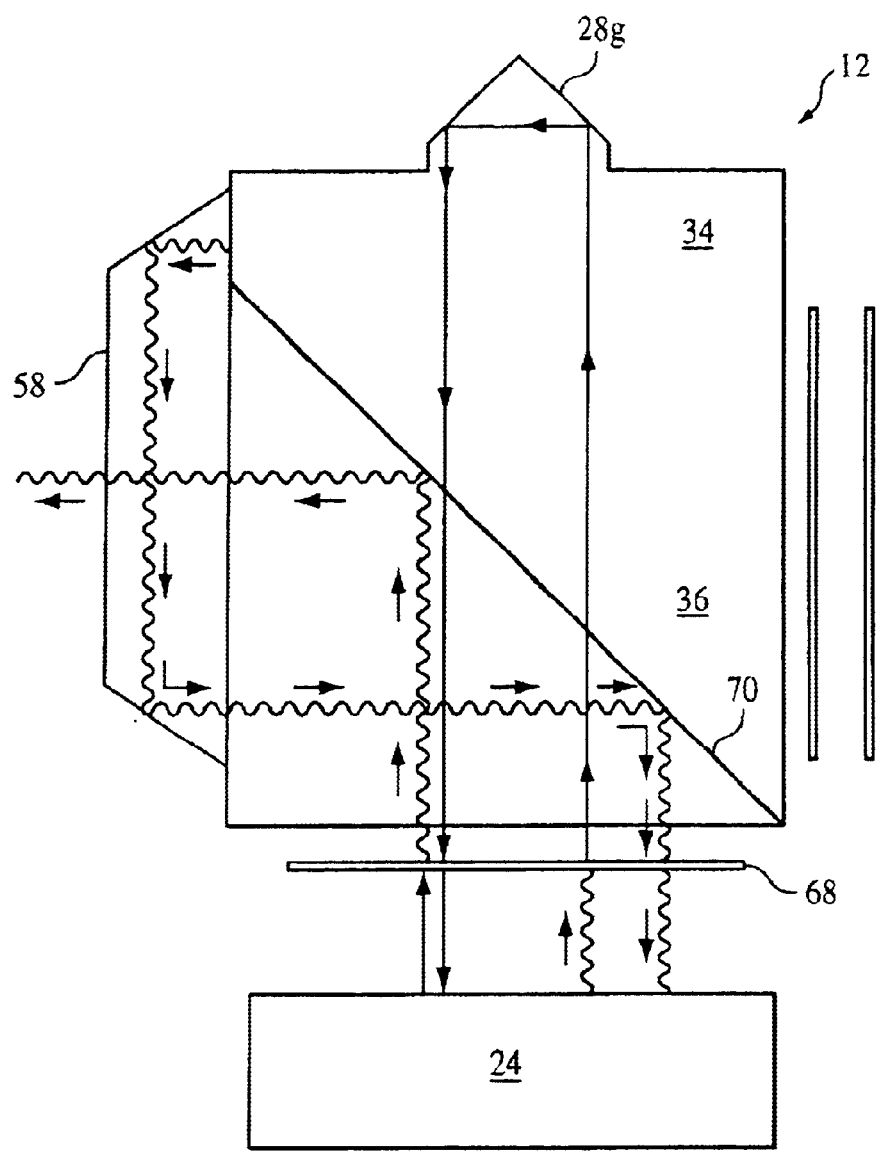
FIG. 7 shows the path followed by the measurement component of the intermediate beam in a plane having one retro-reflector.

FIGS. 6 and 7 show the paths followed by the reference component and the measurement component of the intermediate beam 50a lying in the plane that intersects the bottom row of retro-reflectors. The polarization states of these components shift at certain points along their respective paths through the beam-splitting layer. The shifting polarization states of these components are identified by the straight and wavy lines used to designate certain portions of their paths. The reference and measurement components sometimes traverse the same portion of their respective paths twice, in different polarization states. For clarity, these portions of the paths are shown as being slightly displaced from each other. However, this displacement is shown only to facilitate understanding the operation of the beam-splitting layer 36. In fact, the component is retracing the same physical path, but with different polarization states.

In FIG. 6, the reference component of the input beam 48 emerges from the output coupler 44a and reflects twice off the corner reflector 58 before entering the beam-splitting layer 36 through the I/O face 20. The reference component then reaches the beam-splitting plane 70. Since the reference component is P-polarized, it passes through the beam-splitting plane 70, through the reference face 18, and through the first quarter-wave retarder 64 before reflecting off the reference mirror 66. The reference component then crosses the first quarter-wave retarder 64 once more before re-entering the beam-splitting layer 36 through the reference face 18. The first quarter-wave retarder 64 transforms the P-polarized reference component into an S-polarized reference component. As a result, when the reference component again reaches the beam-splitting plane 70, it is reflected into the retro-reflector 28g.

The retro-reflector 28g reverses the reference component's direction so that it again travels toward the beam-splitting plane 70. Since the reference component is still S-polarized, the beam-splitting plane 70 reflects it back out the reference face 18 to the first quarter-wave retarder 64 and finally to the reference mirror 66. The reference mirror 66 then reflects the reference component back toward the first quarter-wave retarder 64. The first quarter-wave retarder 64 transforms the S-polarized reference component into a P-polarized reference component. As a result, when the reference component again reaches the beam-splitting plane 70, it passes through the beam-splitting plane 70 and exits the beam-splitting layer 36 through the I/O face 20.

In FIG. 7, the measurement component of the intermediate beam emerges from the output coupler 44a and reflects twice off the corner reflector 58 before entering the beam-splitting layer 36 through the I/O face 20. The measurement component then reaches the beam-splitting plane 70. Since the measurement component is, S-polarized, the beam-splitting plane 70 reflects it toward the measurement face 16. The measurement component then proceeds through the measurement face 16, through the second quarter-wave retarder 68, and on to the target 24. After being reflected from the target 24, the measurement component makes a second pass through the second quarter-wave retarder 68. On this second pass, the second quarter-wave retarder 68 changes the S-polarized measurement component into a P-polarized measurement component. As a result, when the measurement component again reaches the beam-splitting plane 70, it passes straight through and proceeds toward the retro-reflector 28g.

The retro-reflector 28g then reverses the measurement component so that it now travels back toward the measurement face 16. On its way to the measurement face 16, the measurement component again encounters the beam-splitting plane 70. Since the measurement component is still P-polarized at this point, the beam-splitting plane 70 again allows it to pass straight through toward the measurement face 16. The P-polarized measurement component then exits the beam-splitting layer 36 through the measurement face 16, passes through the second quarter-wave retarder 68 and proceeds to the target 24. The target 24 again reflects the measurement component back toward the measurement face 16 and through the second quarter-wave retarder 68.

As mentioned earlier in connection with FIG. 1, the two beams that emerge from the monolith 12 are in reality two parts of the same beam. FIG. 7 now makes it clear why this is so. In fact, the beam that emerges from the monolith 12 in FIG. 1 is only the measurement component of one of the intermediate beams 50 derived from the original input beam 48. The reference component of this intermediate beam cannot be seen in FIG. 1 because, as shown in FIG. 7, the reference component exits the monolith 12 only to reach the reference mirror 66, which cannot be seen in FIG. 1.

On its fourth and final pass through, the second quarter-wave retarder 68 transforms the S-polarized measurement component into a P-polarized measurement component. As a result, when the measurement component again reaches the beam-splitting plane 70, it is reflected toward the I/O face 20 of the beam-splitting layer 36, from which it exits the monolith 12.

It is helpful to keep in mind that the measurement component and the reference component, both in their P and S-polarized states, are traversing the same physical path through the beam-splitting layer 36. The beam that ultimately exits the I/O face 20 is thus made up of an S-polarized reference component and a P-polarized measurement component.

By the time they reach the I/O face 20, both the reference component and the measurement component have traversed a path having an internal portion, in which they were both inside the monolith 12, and an external portion, in which they were both outside the monolith 12. The path lengths for the internal portions are the same for both the measurement component and the reference component. The path lengths for the external portion are, however, different. This difference in path length provides a basis for an interferometric measurement of the distance to a point on the target 24.

Figure 8:
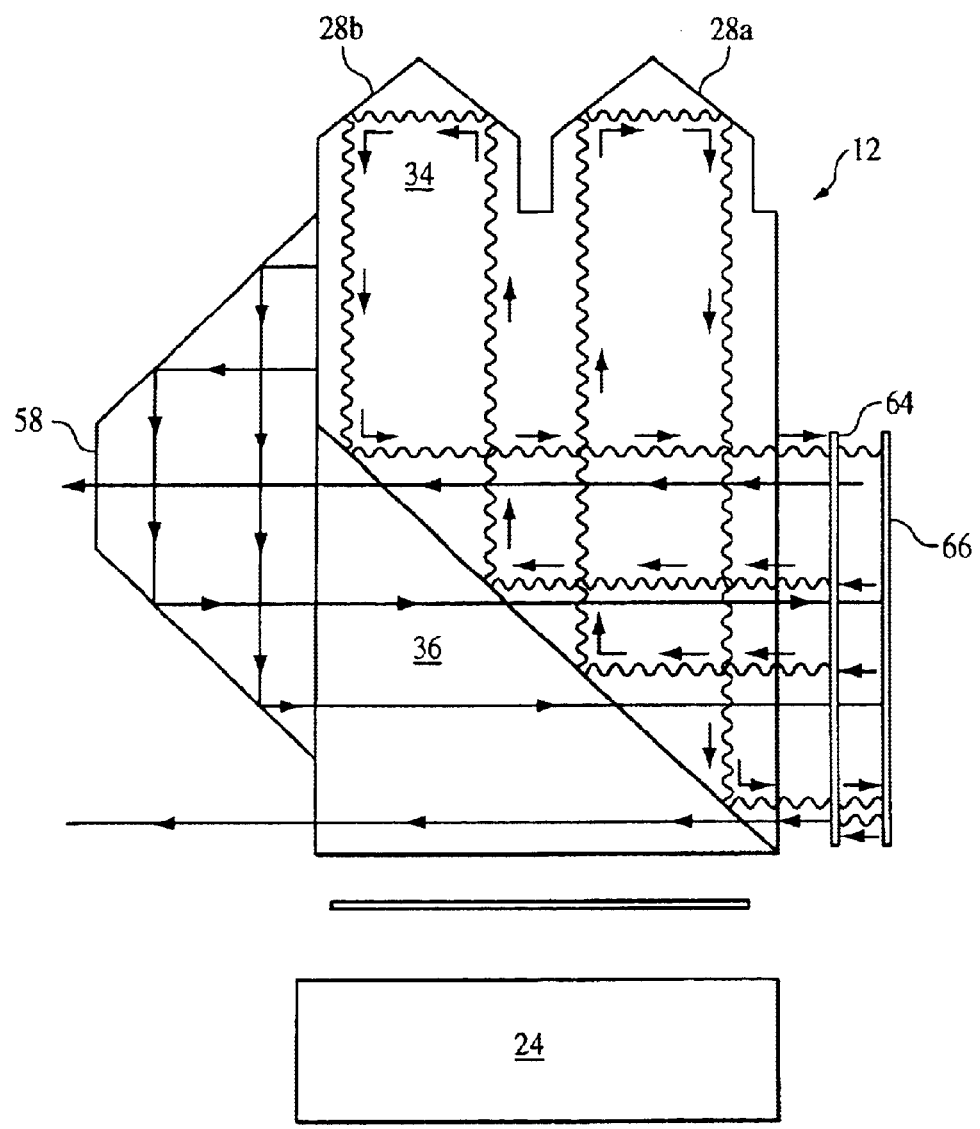
FIG. 8 shows the path followed by the reference component of the intermediate beam in a plane having two retro-reflectors.
Figure 9:
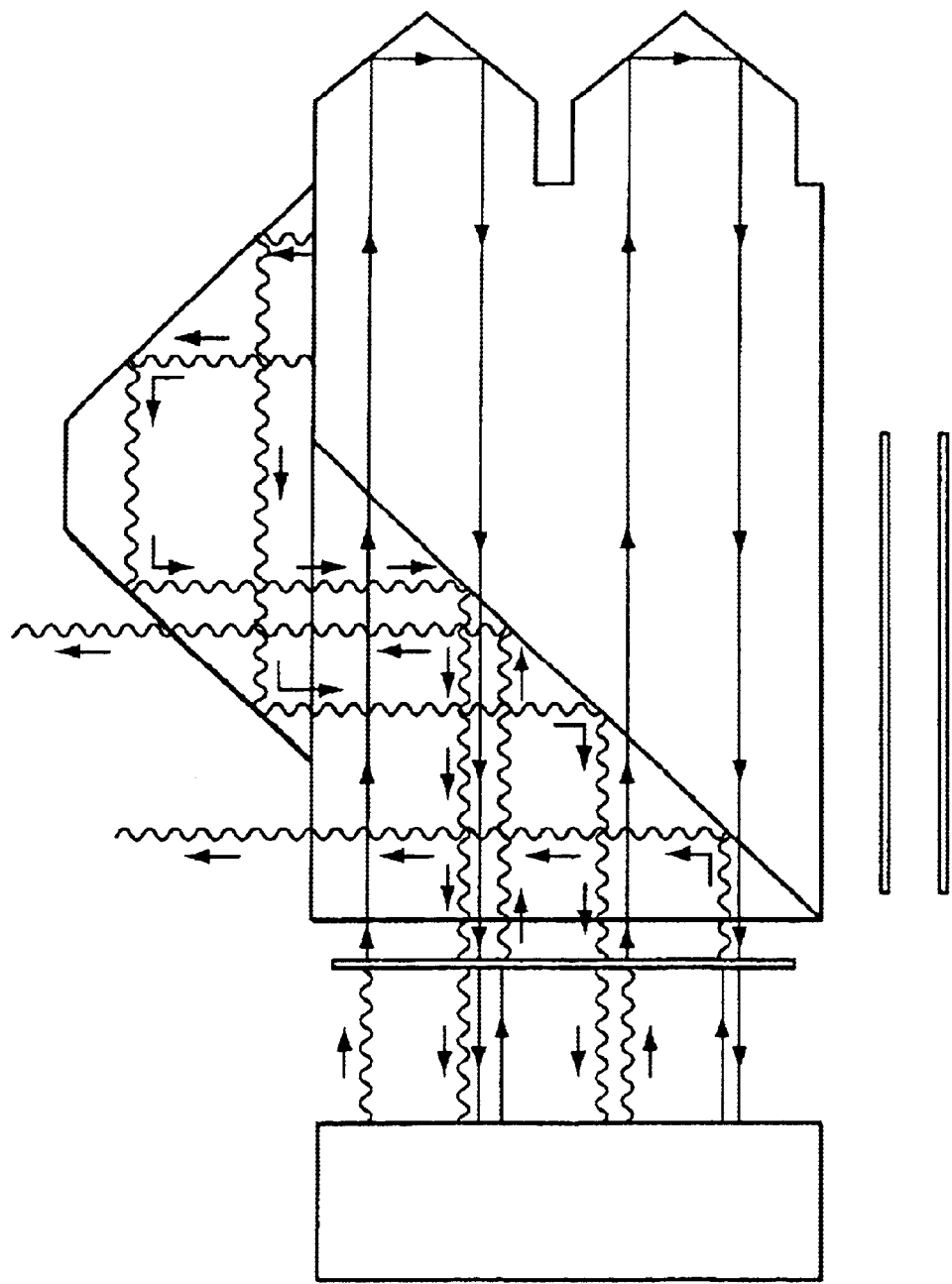
FIG. 9 shows the path followed by the measurement component of the intermediate beam in a plane having two retro-reflectors.

The principles of operation of the beam-splitting layer 36, as illustrated in connection with FIGS. 6 and 7, are readily extended to the case in which there are two or more retro-reflectors. FIGS. 8 and 9 show the paths traversed by two reference components (FIG. 8) and two measurement components (FIG. 9) in a cross-section of the interferometer 10 that lies in a plane intersecting two retro-reflectors 28a–b. One reference component in FIG. 8 and a measurement component in the corresponding location in FIG. 9 are associated with a first intermediate beam, which was derived from the first feed beam 56a shown in FIG. 4. The other reference component in FIG. 8 and the remaining measurement component in FIG. 9 are associated with the second intermediate beam, which was derived from the second feed beam 56b shown in FIG. 4. The paths taken by each reference component and each measurement component are similar to those already described in connection with FIGS. 6 and 7, and need not be discussed in detail.

FIGS. 8 and 9 also illustrate how the two feed beams shown in FIG. 4 illuminate different retro-reflectors in the same row. The reference and measurement components of the first intermediate beam illuminate the first retro-reflector. Similarly, the reference component and measurement components of the the second intermediate beam illuminate the second retro-reflector. Additional retro-reflectors can be fed by providing additional feed beams for generating additional intermediate beams. This can be achieved by providing additional beam splitters in the feed structure 46 shown in FIG. 4.

Having described all the components of the interferometer 10, it is now possible to summarize the operation of the multi-axis interferometer 10 as follows. First, an input beam 48 enters the monolith 12 at the feed structure 46. This input beam 48 includes a reference component and a measurement component that are distinguishable by their respective polarizations. The feed structure 46 divides the input beam 48 into two feed beams 56a–b.

The first feed beam 56a climbs the multiplexing layer 34 of the monolith 12 in a zigzag path having as many switchbacks as there are rows of retro-reflectors. At the end of each switchback, a component of the first feed beam 56a exits the multiplexing layer 34 through an output coupler 44. This portion becomes an intermediate beam that can be used to illuminate a retro-reflector in the row of retro-reflectors that is coplanar with that output coupler 44. In this way, the first feed beam 56a generates as many intermediate beams as there are switchbacks on the zigzag path.

Meanwhile, the second feed beam 56b also climbs the multiplexing layer 34 along an identical zigzag path that is displaced from the zigzag path traversed by the first feed beam 56a. At the end of each switchback, a portion of the second feed beam 56b also exits the multiplexing layer 34 through an output coupler 44. This results in the formation of another intermediate beam that can be used to illuminate another retro-reflector in the row of retro-reflectors that is coplanar with that output coupler 44. In this way, the second feed beam 56b, like the first feed beam 56a, generates as many intermediate beams as there are switchbacks on the zigzag path.

In addition to allowing a portion of each feed beam to escape the multiplexing layer 34, each output coupler 44 also corrects the direction of the intermediate beam that emerges. This is achieved by providing a refractive element that refracts the intermediate beam into a direction normal to the output coupler 44.

Once the intermediate beams exit the multiplexing layer 34, they pass into the corner reflector 58. The corner reflector 58 redirects the intermediate beams back into the monolith 12, and in particular, into the beam-splitting layer 36 of the monolith 12. The beam-splitting layer 36 sends the measurement component of each intermediate beam toward the target 24 and the reference component of each intermediate beam toward the reference plane. It can do so because the reference component and the measurement component of each intermediate beam enter the beam-splitting layer 36 with different polarizations, As a result, the measurement and reference components can be selectively redirected by optical surfaces that transmit selected polarizations and reflect all other polarizations.

By the time they exit the beam splitting layer 36, the reference component and the measurement component will have traversed different distances. This difference can be used as a basis for an interferometric measurement.

Having described the invention and a preferred embodiment thereof, what I claim as new, and secured by Letters Patent is:

1. An apparatus comprising:
   a multi-axis interferometer comprising a polarizing beam splitter block having
   (i) multiple output ports on a common face of the block, each output port positioned to transmit from within the block a corresponding intermediate beam derived from a common input beam, and
   (ii) a polarizing beam splitting interface internal to the block and positioned relative to the common face of the block to separate each intermediate beam into a measurement component and a reference component having different polarizations.

2. The apparatus of claim 1, wherein at least some of the multiple output ports are partially reflective.

3. The apparatus of claim 2, wherein the reflectivities of the output ports are selected to cause the intermediate beams to have substantially equal intensities.

4. The apparatus of claim 2, wherein the block comprises a reflective coating on a face opposite the common face, the reflective coating positioned to redirect any beam portion internally reflected by one of the output ports to be incident on another of the output ports.

5. The apparatus of claim 1, wherein the common input beam or a portion thereof is incident on each output port from within the block, and wherein each output port causes the propagation direction of the transmitted intermediate beam to differ from that of the incident beam.

6. The apparatus of claim 5, wherein each output port diffracts the incident beam to transmit the intermediate beam.

7. The apparatus of claim 5, wherein each output port refracts the incident beam to transmit the intermediate beam.

8. The apparatus of claim 1, wherein the polarizing beam splitting interface causes the measurement and reference components to have orthogonal polarizations.

9. The apparatus of claim 1, wherein the multi-axis interferometer further comprises a corner reflector positioned to redirect each intermediate beam towards the polarizing beam splitting interface.

10. The apparatus of claim 1, wherein the multi-axis interferometer further comprises a reference mirror positioned to reflect each of the reference components back towards the polarizing beam splitter interface, a reference wave plate positioned between the reference mirror and the polarizating beam splitter interface, and a measurement wave plate positioned between the polarizating beam splitter interface and a measurement object.

11. The apparatus of claim 10, wherein the polarizing beam splitter interface is configured to recombine each measurement and reference component with one another after the measurement components make a pass to the measurement object, and wherein the multi-axis interferometer ether comprises a plurality of retro-reflectors each positioned to redirect a corresponding pair of the recombined components back to the polarizing beam splitter interface.

12. A multi-axis interferometer comprising:
    a polarizing beam splitter block having
    (i) multiple output ports on a common face of the block, each output port positioned to transmit from within the block a corresponding intermediate beam derived from a common input beam, and
    (ii) a polarizing beam splitting interface internal to the block and positioned relative to the common face of the block to separate each intermediate beam into a measurement component and a reference component having different polarizations.

* * * * *

UNITED STATES PATENT AND TRADEMARK OFFICE
CERTIFICATE OF CORRECTION

PATENT NO. : 6,876,451 B1
DATED : April 5, 2005
INVENTOR(S) : Andrew Eric Carlson It is certified that error appears in the above-identified patent and that said Letters Patent is hereby corrected as shown below:

<u>Title page,</u>
Item [75], Inventor, replace "Andrew Eric Carlson, Middletown, CT (US)" with
-- Andrew Eric Carlson, Higganum, CT (US) --.

Signed and Sealed this

Thirteenth Day of December, 2005

JON W. DUDAS
*Director of the United States Patent and Trademark Office*